(12) United States Patent
Suzuki

(10) Patent No.: US 7,196,773 B2
(45) Date of Patent: Mar. 27, 2007

(54) ILLUMINATION OPTICAL SYSTEM AND EXPOSURE APPARATUS USING THE SAME

(75) Inventor: Akiyoshi Suzuki, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 54 days.

(21) Appl. No.: 10/538,230

(22) PCT Filed: Sep. 10, 2004

(86) PCT No.: PCT/JP2004/013592

§ 371 (c)(1),
(2), (4) Date: Jun. 9, 2005

(87) PCT Pub. No.: WO2005/027207

PCT Pub. Date: Mar. 24, 2005

(65) Prior Publication Data

US 2006/0012769 A1    Jan. 19, 2006

(30) Foreign Application Priority Data

Sep. 12, 2003 (JP) ............................ 2003-321419

(51) Int. Cl.
*G03B 27/72* (2006.01)
*G03B 27/42* (2006.01)
*G03B 27/54* (2006.01)

(52) U.S. Cl. .............................. 355/71; 355/53; 355/67

(58) Field of Classification Search ................. 355/53, 355/67, 71; 359/558, 629; 362/268
See application file for complete search history.

(56) References Cited

U.S. PATENT DOCUMENTS

| 5,482,801 | A | * | 1/1996 | Smith et al. ................... 430/5 |
| 5,559,583 | A | | 9/1996 | Tanabe |
| 6,095,667 | A | * | 8/2000 | Kamihara et al. .......... 362/311 |
| 7,095,560 | B2 | * | 8/2006 | Toyoda et al. .............. 359/558 |
| 2001/0055107 | A1 | | 12/2001 | Tsuji |
| 2006/0055909 | A1 | * | 3/2006 | Fiolka et al. ................. 355/71 |

FOREIGN PATENT DOCUMENTS

| JP | 06-204121 | 7/1994 |
| JP | 07-135145 | 5/1995 |
| JP | 07-307268 | 11/1995 |
| JP | 11-176721 | 7/1999 |
| JP | 2000-021748 | 1/2000 |
| JP | 2001-284212 | 10/2001 |

OTHER PUBLICATIONS

International Search Report dated Dec. 8, 2004.

* cited by examiner

*Primary Examiner*—Alan Mathews
(74) *Attorney, Agent, or Firm*—Morgan & Finnegan, LLP

(57) ABSTRACT

An illumination optical system for illuminating an illuminated surface using light from a light source includes a first diffraction optical element upon which the light from the light source is incident, and a second diffraction optical element upon which the light from the light source is incident, wherein the light from the first diffraction optical element forms a first part of an illumination distribution on a predetermined surface that substantially has a Fourier transform relationship with the illuminated surface, and the light from the second diffraction optical element forms a second part of the illumination distribution.

16 Claims, 15 Drawing Sheets

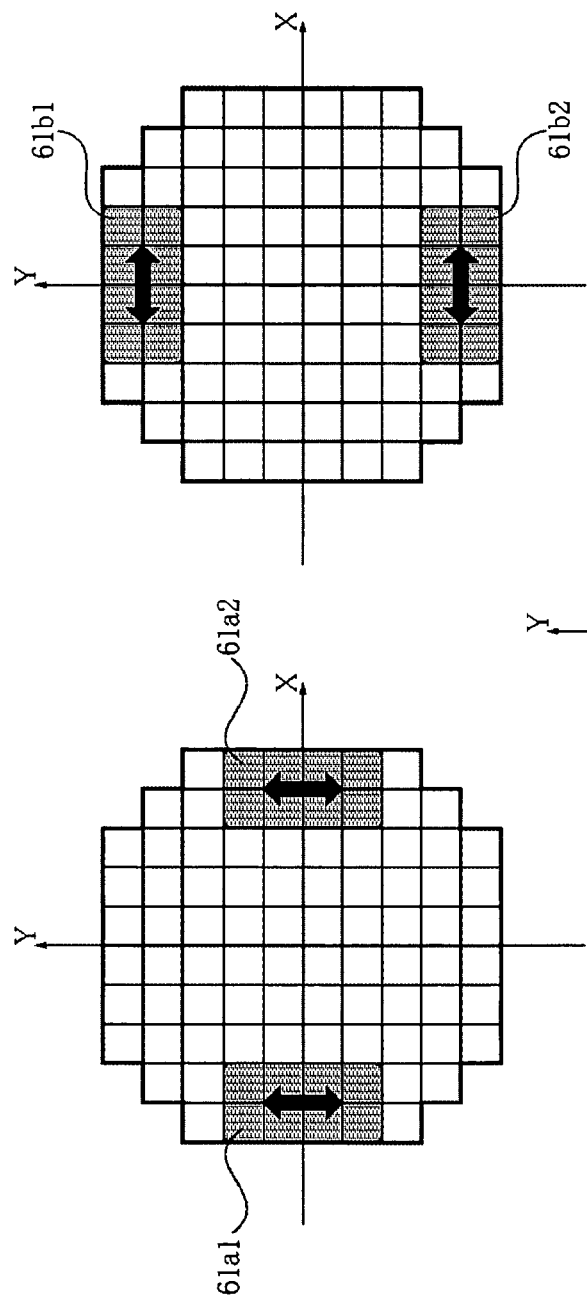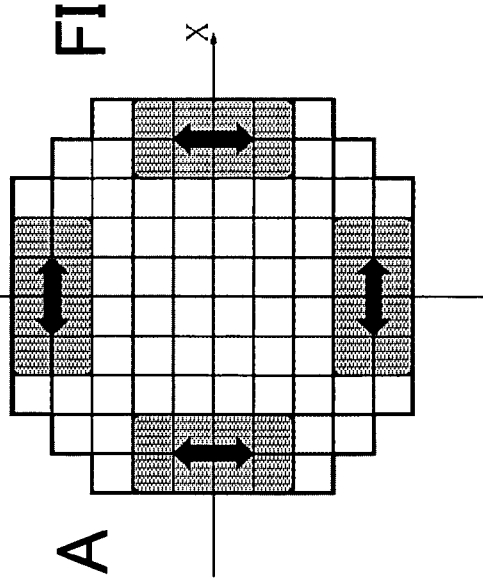

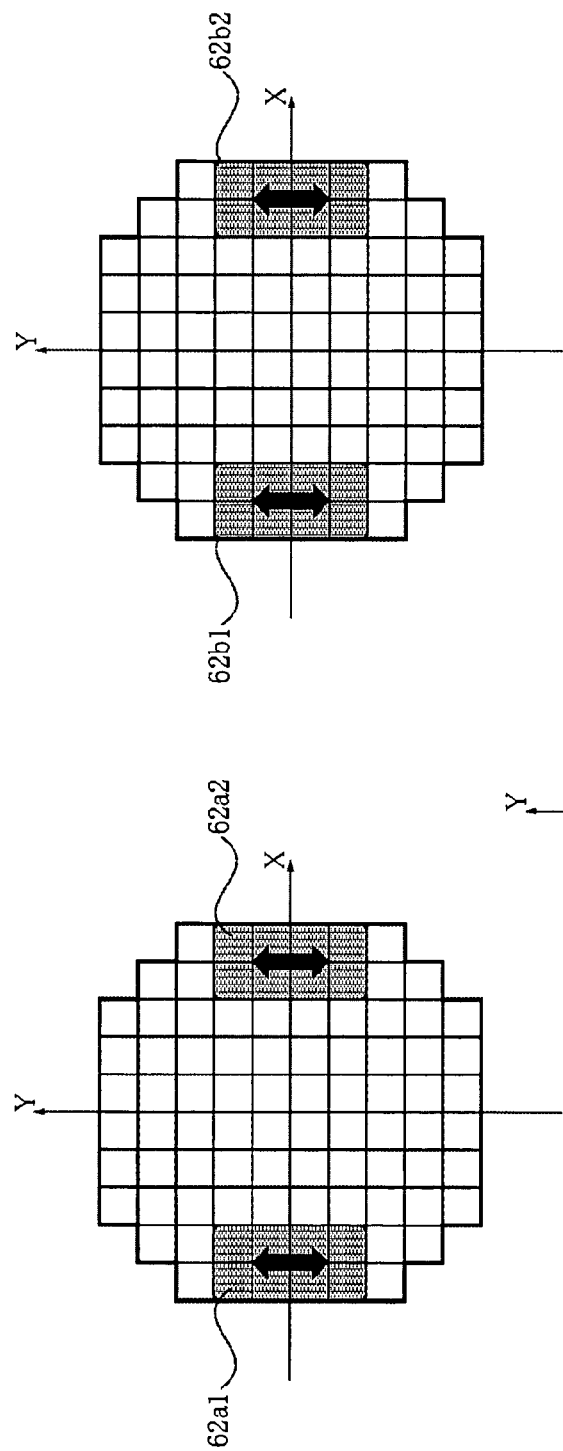

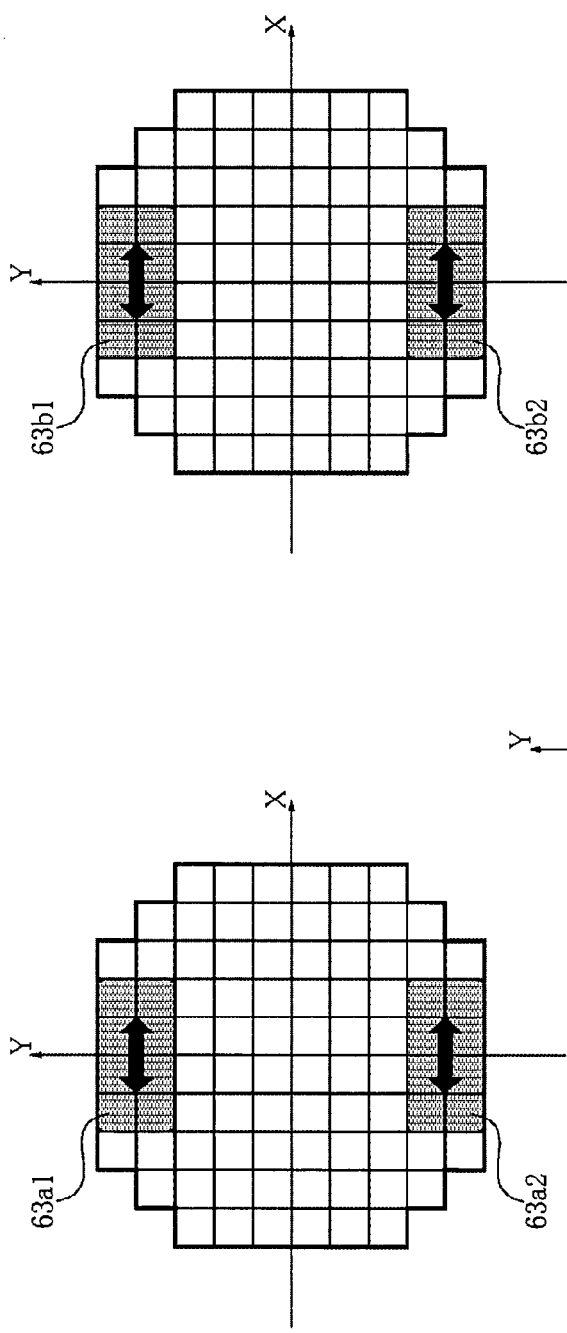

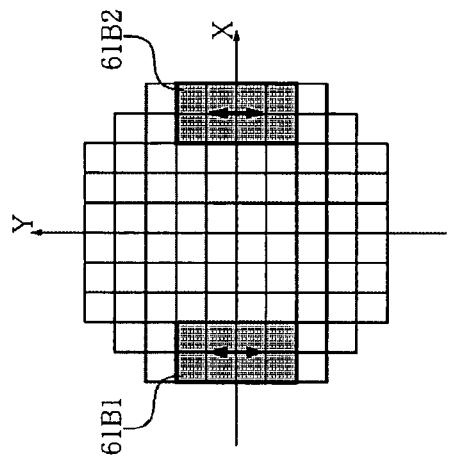
FIG. 9A
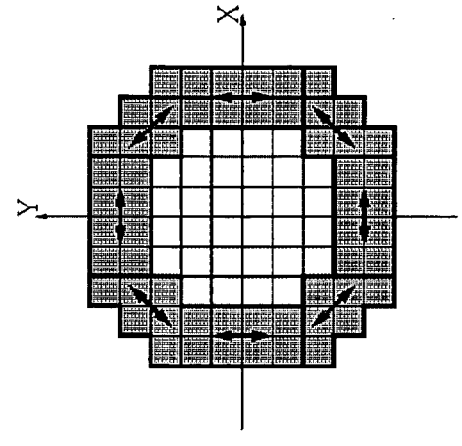
FIG. 9B
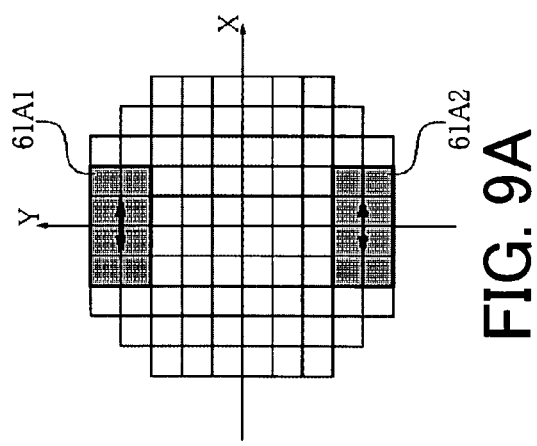
FIG. 9C
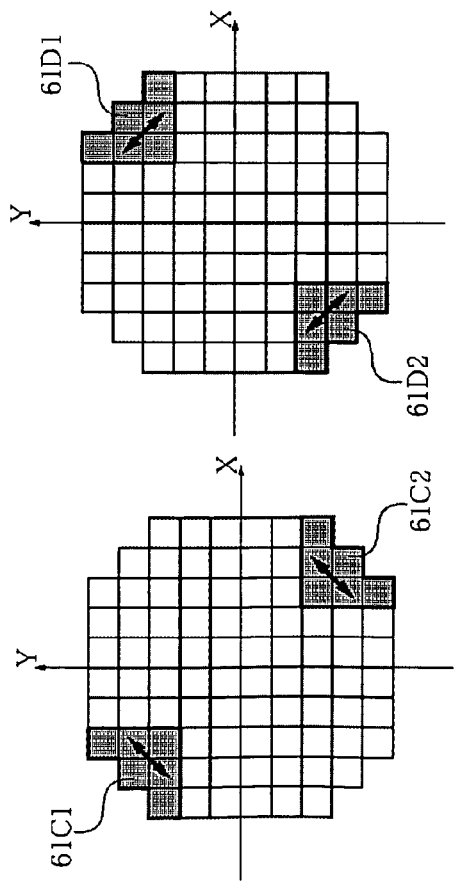
FIG. 9D
FIG. 9E

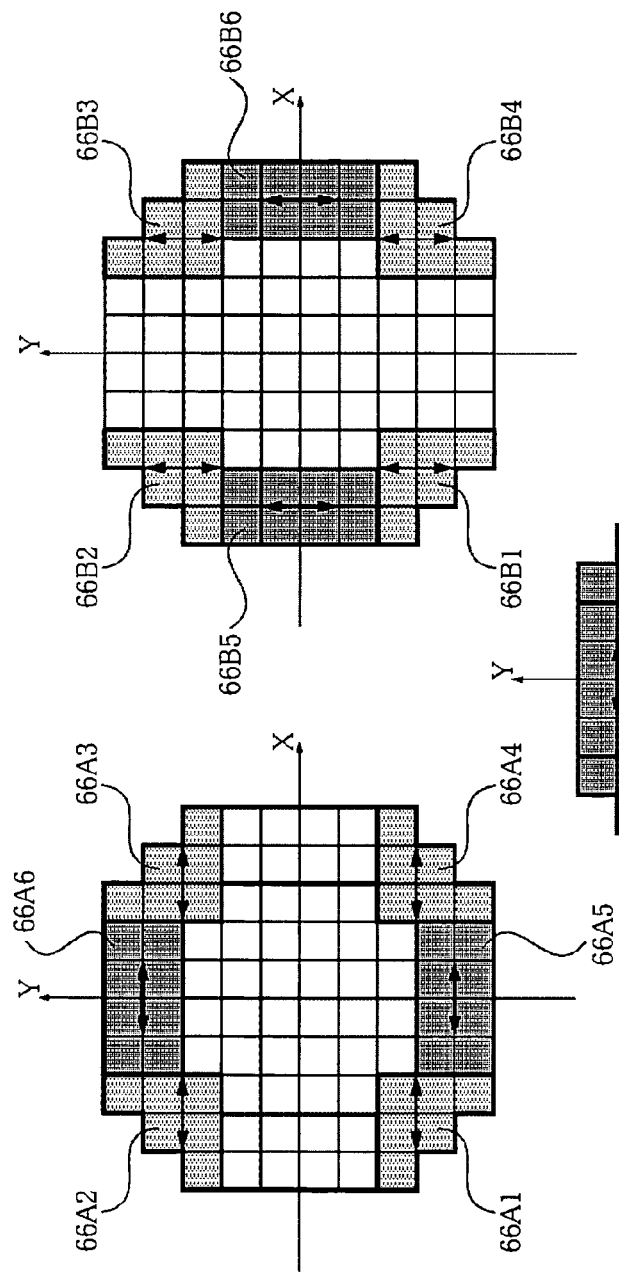
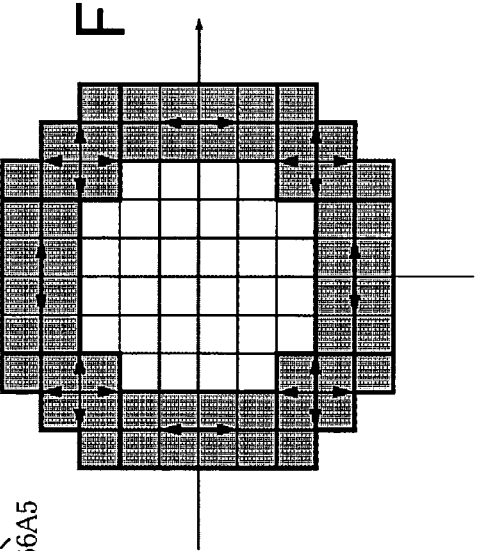
FIG. 11A
FIG. 11B
FIG. 11C

ILLUMINATION OPTICAL SYSTEM AND EXPOSURE APPARATUS USING THE SAME

TECHNICAL FIELD

The present invention relates to illumination optical systems and exposure apparatuses using the same, and particularly to an illumination optical system that handles polarization and an exposure apparatus that exposes an object, such as a single crystal substrate for a semiconductor, a glass plate for a liquid crystal display.

BACKGROUND ART

As a semiconductor device becomes finer, an exposure wavelength used in a semiconductor exposure apparatus becomes shorter down to a KrF laser (with a wavelength of 248 nm), an ArF laser (with a wavelength of 193 nm), and a $F_2$ laser with a wavelength of 157 nm. At the same time, the NA of a projection optical system becomes higher up to 0.90 in an ordinary atmosphere, and beyond 1.2 for a projection optical system of an immersion type exposure apparatus.

The fine patterning of a semiconductor device is a major factor that supports the dynamics of the semiconductor industry, and the generation is swiftly changing from the age that required a resolution of 0.25 μm at 256 MDRAM to 180 nm, 130 nm and further to 100 nm and beyond. In the age of the lithography using the i-line (365 nm), they didn't realize the resolution less than the wavelength. However, the KrF, having a wavelength of 248 nm, has been applied to the critical dimension of 180 nm down to 130 nm. The age that practically uses the resolution less than the wavelength has really arrived through the progress of resist and the use of results out of resolution enhancement technologies (RET), etc. Various RET would reduce the critical dimension to one-third of the wavelength in line and space patterns.

However, RET often has pattern-induced limits, and therefore, the royal road to the improvement of resolution is, after all, to make the wavelength short while improving the NA of a projection optical system. Recently, a minute imaging analysis emphasizes considerations of parameters that have been ignorable in the past, such as flare, and the polarization due to the property of the light as electromagnetic waves.

Among them, the issue of polarization has gradually had a great impact as a projection optical system's NA becomes larger. The issue that polarization presents is such that when two rays intersect each other, they don't interfere with each other if the two rays' polarized directions are orthogonal to each other. If two rays are symmetrically arranged to the optical axis, the angle of the optical axis with one ray becomes 45°. The NA close to 0.71 causes a pair of rays to satisfy this orthogonal condition. Therefore, a current projection optical system having more than 0.80 already met the condition in which the imaging rays do not interfere with each other in the aerial image.

The effect of this orthogonal condition becomes more prominent in an immersion type exposure apparatus, because even if the orthogonal condition is present in the aerial image obtained in the air, nitrogen, or helium circumstances (hereinafter called dry), an angle $\theta_{PR}$ that the light entering a resist having a refractive index of $n_{PR}$ at an angle $\theta_o$ has in the resist is expressed as follows:

$$\sin \theta_o = n_{PR} \sin \theta_{PR} \quad (1)$$

The angle $\theta_{PR}$ thus becomes smaller than $\theta_o$, and does not satisfy the orthogonal condition in the resist.

Usually, since the refractive index of the resist at a wavelength of 193 nm is about 1.7. If $\theta_{PR}$ becomes 45°, the right-hand side of the equation (1) becomes 1.7×sin 45°=1.20, which is more than 1. Therefore, $\theta_{PR}$ 45° condition never exists in the dry case.

However, in the immersion exposure that fills with liquid the space between a resist and a projection optical system, the refraction effect is greatly reduced, and $\theta_{PR}$ can be 45°.

Some solutions for this issue have been proposed which control the polarization of an illumination optical system and maintain the contrast of an image formed by a projection optical system. (See, for example, Japanese Patent Applications, Publication Nos. 8-008177, 4-366841, 5-088356, 5-090128, 6-124872, 6-181167, and 6-188169.)

In order to expose a pattern with a high resolution, RET takes a measure to control an angular distribution for illuminating reticles and to construct an optimal illumination optical system. Various proposed light source shapes, such as quadruple, dipole, sextuple as well as the conventional simple annulus contribute to enlarge the exposure latitude and the depth of focus. A CGH (Computer Generated Hologram) inserted as a diffraction optical element into an illumination optical system provides flexibility to form various light source shape requirements, thus making an important contribution to the progress of optical lithography. See, for example, Japanese Patent Applications, Publication Nos. 2001-284212 and 11-176721.

However, the control of polarization that has become especially conspicuous for an immersion type exposure apparatus, and the flexibility of the illumination optical system are newly required issues.

An illumination optical system should be suitable for a high NA optical system, such as a projection optical system used in an immersion type exposure apparatus, while reconciling polarization to the optical system having a diffraction optical element.

DISCLOSURE OF INVENTION

An illumination optical system according to one aspect of the present invention for illuminating an illuminated surface using light from a light source includes a splitting optical system for splitting the light from the light source into light incident upon a first diffraction optical element, and light incident upon a second diffraction optical element, a first polarization unit for adjusting a polarization state of the light from the first diffraction optical element, a second polarization unit for adjusting a polarization state of the light from the second diffraction optical element, and an integrating optical system for integrating the light from the first diffraction optical element with the light from the second diffraction optical element, and for introducing integrated light into the illuminated surface.

Other features and advantages of the present invention will be apparent from the following description given in conjunction with the accompanying drawings, in which like reference characters designate the same or similar parts throughout the figures thereof.

BRIEF DESCRIPTION OF DRAWINGS

The accompanying drawings, which are incorporated in and constitute a part of the specification, illustrate embodiments of the invention and, together with the description, serve to explain the principles of the invention.

FIG. 3A is a view showing a light intensity distribution formed by a CGH 6a. FIG. 3B is a view showing a light intensity distribution formed by a CGH 6b. FIG. 3C is a view showing an example of quadruple illumination.

FIG. 4A is a view showing a light intensity distribution formed by a CGH 6a. FIG. 4B is a view showing a light intensity distribution formed by a CGH 6b. FIG. 4C is a view showing an example of a dipole illumination.

FIG. 5A is a view showing light intensity distribution formed by a CGH 6a. FIG. 5B is a view showing a light intensity distribution formed by a CHG 6b. FIG. 5C is a view showing an example of a dipole illumination orthogonal to FIG. 4C.

FIG. 6A is a view showing a light intensity distribution formed by a CGH 6a.

FIG. 7A is a view showing a light intensity distribution formed by a CGH 6a.

FIG. 9A is a view showing a light intensity distribution formed by a CGH. FIG. 9B is a view showing a light intensity distribution formed by a CGH. FIG. 9C is a view showing a light intensity distribution formed by a CGH. FIG. 9D is a view showing a light intensity distribution formed by a CGH. FIG. 9E is a view showing an example of an annular illumination with tangential polarization.

FIG. 11A is a view showing a light intensity distribution formed by a CGH. FIG. 11B is a view showing a light intensity distribution formed by a CGH. FIG. 11C is a view showing an example of an illumination with non-polarization in ±45° directions around a cross-shaped non-illuminated part, and with tangential polarization in ±90° directions.

BEST MODE FOR CARRYING OUT THE INVENTION

Preferred embodiments of the present invention will now be described in detail in accordance with the accompanying drawings.

First Embodiment

Figure 1:
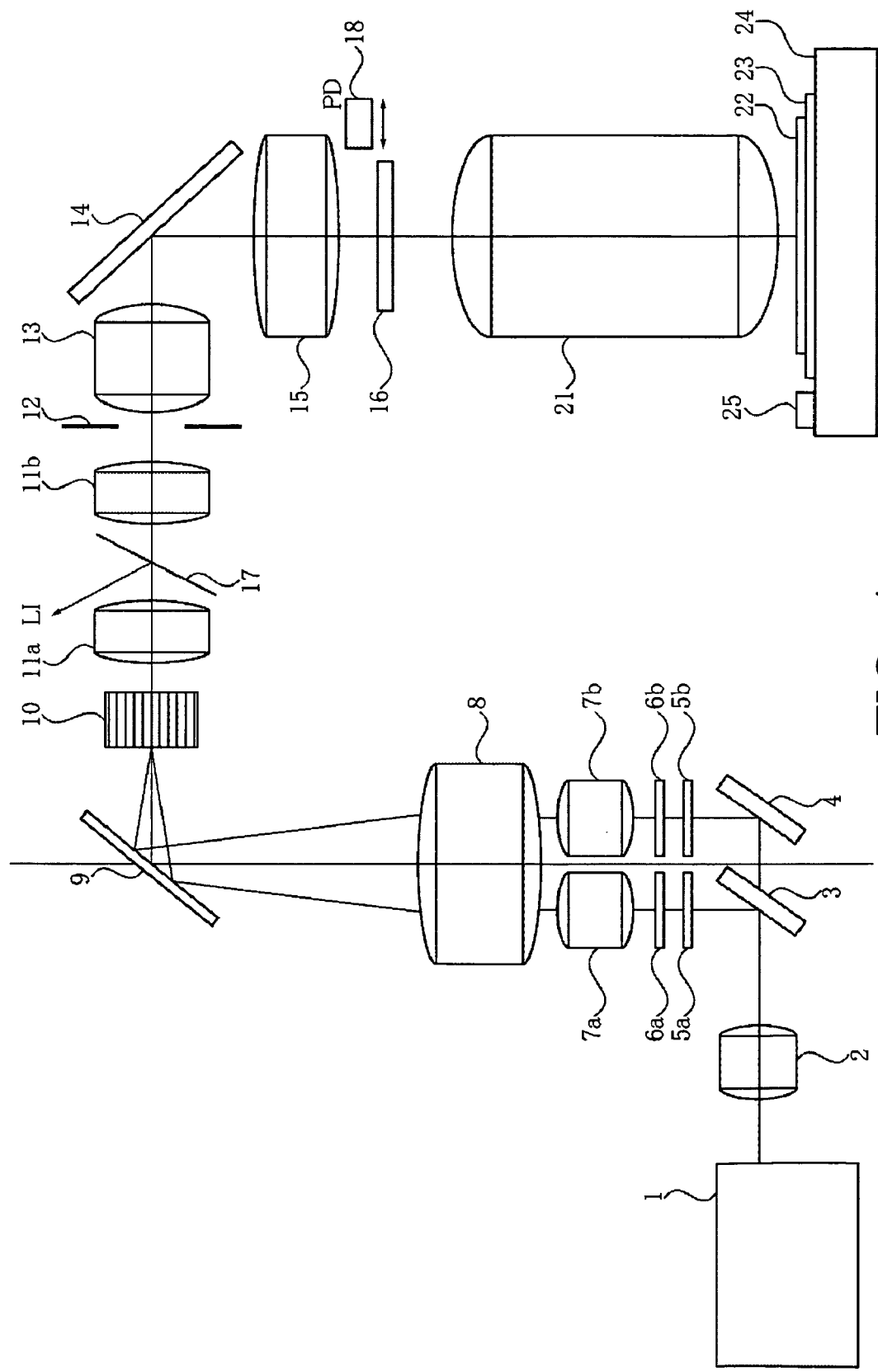
FIG. 1 is a diagram showing an exposure apparatus of a first embodiment.

FIG. 1 shows a structure of an illumination optical system used in an exposure apparatus of a first embodiment.

An excimer laser 1 is used for the exposure apparatus as a light source. It provides linearly polarized light. In order to control the polarization state of the whole illumination optical system, this embodiment utilizes the polarization characteristics that the laser originally possesses.

The excimer laser is shaped by a beam-shaping optical system 2 having a beam expander, etc. such that it may be adjusted for the optical systems that follow, and then, enters a beam splitter 3 as a splitting optical system, being split into two. Actually, the laser is located distant from the exposure apparatus for installation convenience, and light is often guided a long way up to the beam splitter via a beam delivery system. Because of the guidance from the laser to the beam splitter, if the laser beam enters the beam splitter 3 as an s-polarized light, the coating of the beam splitter may be set such that s-polarized light is split with an intensity ratio of 1:1.

If the laser is of non-polarization, a polarization beam splitter is used for the beam splitter 3. Even in this case, the split rays become two linearly polarized lights that are orthogonal to each other with the almost equal intensity. In other words, the splitting operation almost equalizes the intensity of the optical path of the split light as a linear polarization state.

The light having transmitted the beam splitter 3 is reflected on a mirror 4. The split beams enters, through separate optical paths, polarization units 5a and 5b, and CGH 6a and 6b, respectively. A description of their operations will be given later, but in summary each optical path is independently provided with the polarization unit for adjusting the polarization state and the CGH for forming an effective light source shape. That is, it is important in the instant embodiment that a first optical system that includes the polarization unit 5a and the CGH 6a, and a second optical system that includes the polarization unit 5b and the CGH 6b are set on different optical paths, respectively.

Then, the beams go through collimators 7a and 7b, and enter a beam integrating optical system 8, thus arriving at an integrator 10. The integrator 10 is a fly's-eye lens, and forms a plurality of secondary light sources at its exit surface.

The illumination optical system after the integrator 10 includes condensers 11a and 11b, a slit 12, a condenser 13, a mirror 14, and a collimator 15, and illuminates a reticle (or a mask). In order to control an exposure light intensity, a beam splitter 17 is arranged between the condensers 11a and 11b in the instant embodiment, and takes out light so as to detect a light intensity given by the illumination optical system. A photodetector 18 is movably arranged on the reticle surface, and detects the light intensity on the reticle surface.

The light having passed through the reticle 16 is projected and imaged onto a wafer 22 via a projection optical system 21. The wafer 22 is set on a wafer chuck 23, and the wafer chuck 23 is installed on a wafer stage 24. A detecting system 25 has a detector for detecting a light intensity, and is mounted on the wafer stage. The detecting system 25 detects the light intensity that has passed through the whole illumination and projection optical systems.

While this embodiment arranges the photodetector on the reticle surface or a position corresponding to the wafer surface, the detector can be placed at a location corresponding to the pupil position to perform a similar function.

Figure 2:
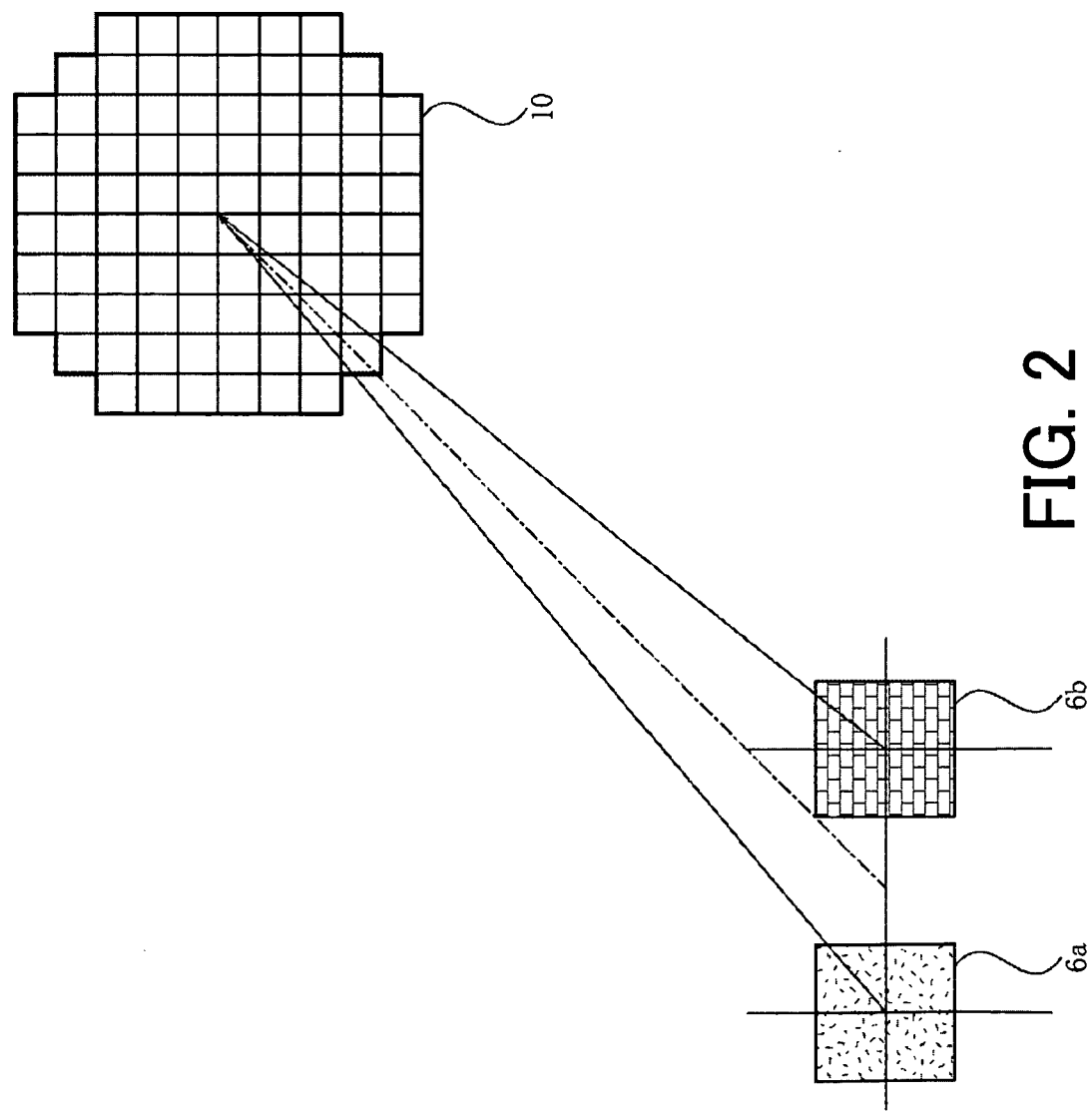
FIG. 2 is a view for explaining the principle that controls the flexibility of an effective light source and a polarization state.

FIG. 2 shows the method of forming the effective light source required for an exposure apparatus and a principle of controlling the polarization state. It shows the relationship between the CGH 6a and 6b and the integrator 10. The embodiment in FIG. 1 uses CGH 6a and 6b to form a necessary effective light source distribution over the integrator 10, while separating optical paths for 6a and 6b and independently controlling the polarization on each optical path. Thus, this embodiment can effectively use the light, control polarization, and efficiently forms a whole illumination optical system. This embodiment uses a fly's-eye lens as an integrator, and forms an effective light source distribution at its incident plan. The similar effective light source distribution is formed at the exit plane of the fly's eye lens. In short, the CGH 6a and 6b are arranged at a place that substantially has a Fourier transform plane (pupil conjugate plane) to the reticle, and used to form an effective light source distribution at the incident plane of the fly's eye lens. The integrator that uses an optical pipe as an internal reflecting mirror can provide similar effects.

FIGS. 3A to 3C are views showing the principle, for example, of the quadruple illumination as an effective light source on the X and Y axes. As illustrated in FIG. 3C it is desirable that the effective light source on the Y-axis has a lateral polarization, and the effective light source on the X-axis has a longitudinal polarization. The CGH 6a makes a distribution on the X-axis of the element 10 like a 61a1 and 61a2 as shown in FIG. 3A. The polarization state is a linear polarization in the longitudinal direction. On the other band, the CGH 6b makes a distribution on the Y-axis of the element 10 like a 61b1 and 61b2 as shown in FIG. 3B. The polarization state is a linear polarization in the lateral direction. The same CGH 6a and 6b can be used, but rotated by 90° when arranged. The polarization controlling elements 5a and 5b control the polarization direction, and use a rotational λ/2 plate and the like. Since the polarization controlling elements 5a and 5b are separate from each other, the polarization state of lights that have passed the CGH 6a and 6b can be controlled independently to lead them to the integrator 10. The resultant effective light source is shown in FIG. 3C, by which illumination is materialized whose polarization direction is a tangential direction orthogonal to a line that connects the center.

The effective light source having passed the same CGHs, i.e., the 61a1 and 61a2, and 61b1 and 61b2 can be set by the CGHs to have the same light intensity, but light on the 61a system and that on the 61b system need to be made equal in terms of the light intensity. An ND filter for light intensity adjustment if provided in each optical path would provide proper control over the exposure ray width. Since an actual adjustment quantity is minute, a stop that has a variable diameter may be put in the optical path before entering the CGH for mutual adjustments. A detailed description of the light intensity adjustment function will be given later.

The CGH works effectively for a dipole illumination. FIG. 4 shows a dipole illumination formed on the X-axis. Like FIG. 3, the CGH 6a makes a distribution on the X-axis of the element 10 like 62a1 and 62a2 as shown in FIG. 4A. The polarization state is linear polarization in a longitudinal direction. On the other hand, the CGH 6b also makes a distribution on the X-axis of the element 10 like a 62b1 and 62b2 as shown in FIG. 4B. The polarization state is linear polarization in a longitudinal direction. The same CGH 6a and 6b can be used in the same arrangement. The operations of the polarization controlling elements 5a and 5b provide the same polarization state to lights that have passed the CGH 6a and 6b. The polarization controlling elements 5a and 5b merely rotate polarization direction and do not reduce the light intensity. Therefore, the dipole illumination has the same efficiency as the quadruple illumination in FIG. 3.

FIG. 5C is a view of a dipole illumination rotated by 90° from that of FIG. 4C. The CGH 6a makes a distribution on the Y-axis of the element 10 like 63a1 and 63a2 shown in FIG. 5A. The polarization state is linear polarization in the lateral direction. On the other hand, the CGH 6b also makes a distribution on the Y-axis like 63b1 and 63b2 shown in FIG. 5B. The polarization direction is also a lateral direction. The same CGH 6a and 6b as FIG. 4C can be used although rotated by 90° when arranged. Also in this case, the operations of the polarization controlling elements 5a and 5b provide the light having passed the CGH 6a and 6b to the same polarization state. The illumination efficiency is the same as that of the quadruple illumination of FIG. 3C.

Figure 6A:
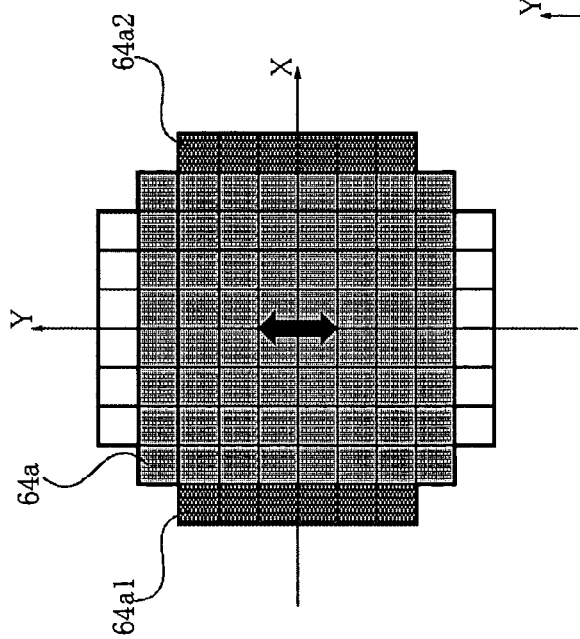
Figure 6B:
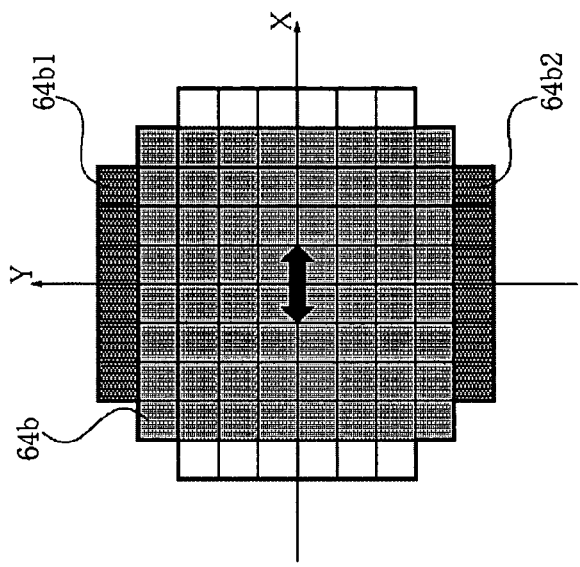
FIG. 6B is a view showing a light intensity distribution formed by a CGH 6b.
Figure 6C:
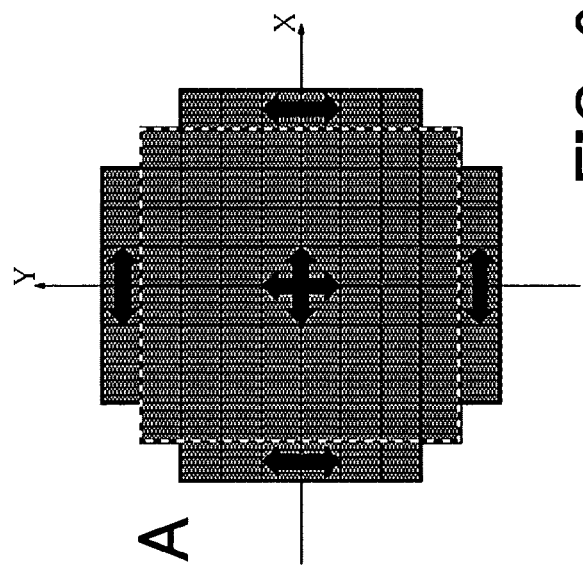
FIG. 6C is a view showing an example of an illumination with no polarization in the central part and tangential polarization in the periphery.

The CGH can easily form a more complicated effective light distribution. FIG. 6C shows one embodiment that forms a effective light source having a central part with no polarization, and a peripheral part with a tangential polarization. In FIG. 6A, the intensity at the central portion 64a of the effective light source formed by the CGH 6a is half the intensity of the peripheral portions 64a1 and 64a2, and the polarization direction is adjusted to be a longitudinal direction. As shown in FIG. 6B, the intensity at the central portion 64b of the effective light source formed by the CGH 6b is half the intensity of the peripheral portions 64b1 and 64b2, and the polarization direction is controlled to be a lateral direction. The intensity difference is illustrated in colors. If they are synthesized, an effective light source has a uniform intensity distribution, in which the central part has no polarization, and only the periphery has a tangential polarization as shown in FIG. 6C.

Figure 7A:
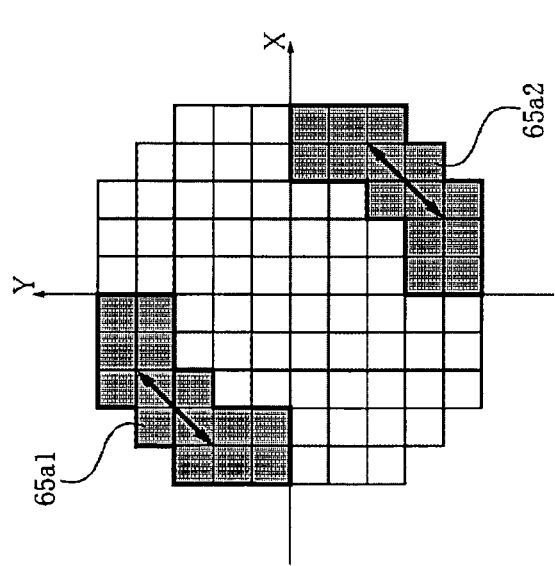
Figure 7B:
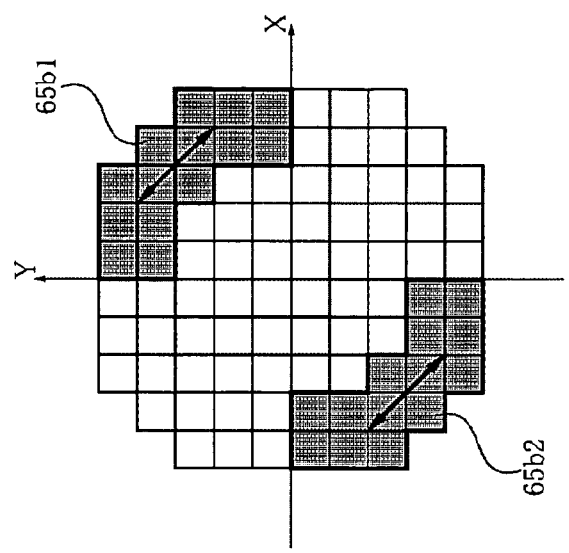
FIG. 7B is a view showing a light intensity distribution formed by a CGH 6b.
Figure 7C:
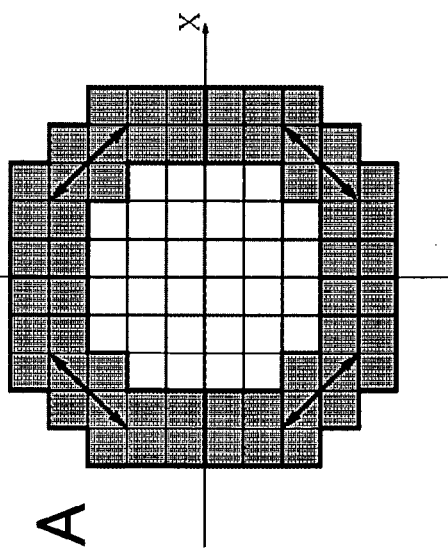
FIG. 7C is a view showing an example of an annular illumination with tangential polarization in ±45° directions.

The polarization direction is controllable in not only longitudinal and lateral directions, but any arbitrary direction, if, for example, a polarization unit 5 includes a rotational λ/2 plate, by controlling a set angle of the λ/2 plate. FIG. 7C is an example of an annular illumination that has a tangential polarization state by combining ±45° polarization directions. One CGH 6a forms effective light sources 65a1 and 65a2 in the +45 direction as illustrated in FIG. 7A, and the other CGH 6b forms effective light sources 65b1 and 65b2 in the −45 direction as illustrated in FIG. 7B. The superimposed light sources form the annular illumination on the integrator 10 in the ±45° polarization directions.

An effective light source distribution can also be formed as shown in FIGS. 11A to 11C, which has a cross-shaped non-illuminated part in the center, no polarization in the ±45° directions in its periphery, and a tangential polarization in the 0° and ±90° directions.

It is also possible to easily realize a combination of a more complicated effective light source distribution and polarization directions.

A different effective light source is variable by exchanging the CGH in accordance with a light source shape. For example, the CGH need be exchanged between ⅔ and ¾ annular illuminations. An outer diameter of the effective light source, which is an important parameter, needs to be determined in the annular illumination. This corresponds to control over an annulus's size (or diameter) formed on the integrator 10, and a beam integrating optical system 8 plays this role. The element 8 has a zooming function to change a size of the annulus as well as a size of another effective light source on the integrator 10.

Of course, the illumination optical system needs to form a normal circular illumination shape. This needs an adjustment of so-called σ (=NA of an illumination optical system's reticle side/NA of a projection optical system's reticle side). Thus, a variable beam diameter on the integrator's incident surface is needed to change a shape of the light intensity distribution on the illumination optical system's pupil surface (which has a Fourier transform relationship with the reticle surface or is conjugate with the integrator 10's exit surface). The zooming function of the element 8 meets this requirement of variability. A CGH 6 that forms a circular pattern is used for the integrator in creating a circular shape of the effective light source. Alternatively, an optical system using an ordinary lens may be inserted in an optical system as a turret, utilizing the circular shape. In some cases, the same light intensity of linearly polarized rays that are orthogonal to each other is required in order to attain the two dimensional CD control.

As discussed, the embodiment remarkably improves the flexibility of the illumination optical system by an exchange of the CGH as a diffraction optical element and the zooming function, and can control the polarization direction.

A provision of many kinds of CGHs would take tune for exchange and increase the cost. The number of necessary CGHs can be reduced if each CGH has a rotational function. For example, suppose the illustrative dipole illuminations shown in FIGS. 4C and 5C where both dipole illuminations are different in that the same shape is simply rotated by 90° between FIGS. 4C and 5C. A description will now be given of FIG. 4C by referring to the system's numerals in FIG. 1. The CGHs 6a and 6b may be exactly the maine since they form the same effective light source shape on the integrator 10. In other words1 the same CGH can be used.

The dipole in FIG. 5C is the dipole shape of FIG. 4C rotated by 90°. In this case, the CGH used in the system of FIG. 4C may be rotated 90°. Accordingly, if the CGH itself has a rotation function, there is no need to exchange the CGH when changing from the effective light source shown in FIG. 4C to that of FIG. 5C. If each dipole structure in the quadruple in the system shown in FIG. 3C is equivalent to that shown in FIGS. 4C and 5C, or if the portions 61a1 and a2 in FIG. 3A are equivalent to the portions 62a1 and a2 in FIG. 4A, and the portions 61b1 and b2 in FIG. 3B are equivalent to the portions 63b1 and b2 in FIG. 5B, two CGHs of the same type are needed to create the effective light source shown in FIGS. 3C, 4C and 5C. In this case, "equivalent" means the same shape, ignoring the directionality.

CGHs of multiple types may be necessary to form other types of effective light source shapes so that each CGH is inserted into and removed from the optical path. For example, the CGHs may be placed on a turret and switchably inserted into the optical path.

While the above embodiment varies the polarization state by arranging a polarization unit at each of the multiple optical paths, all or part of them may be omitted if there is no need to change the polarization.

Second Embodiment

Figure 8:
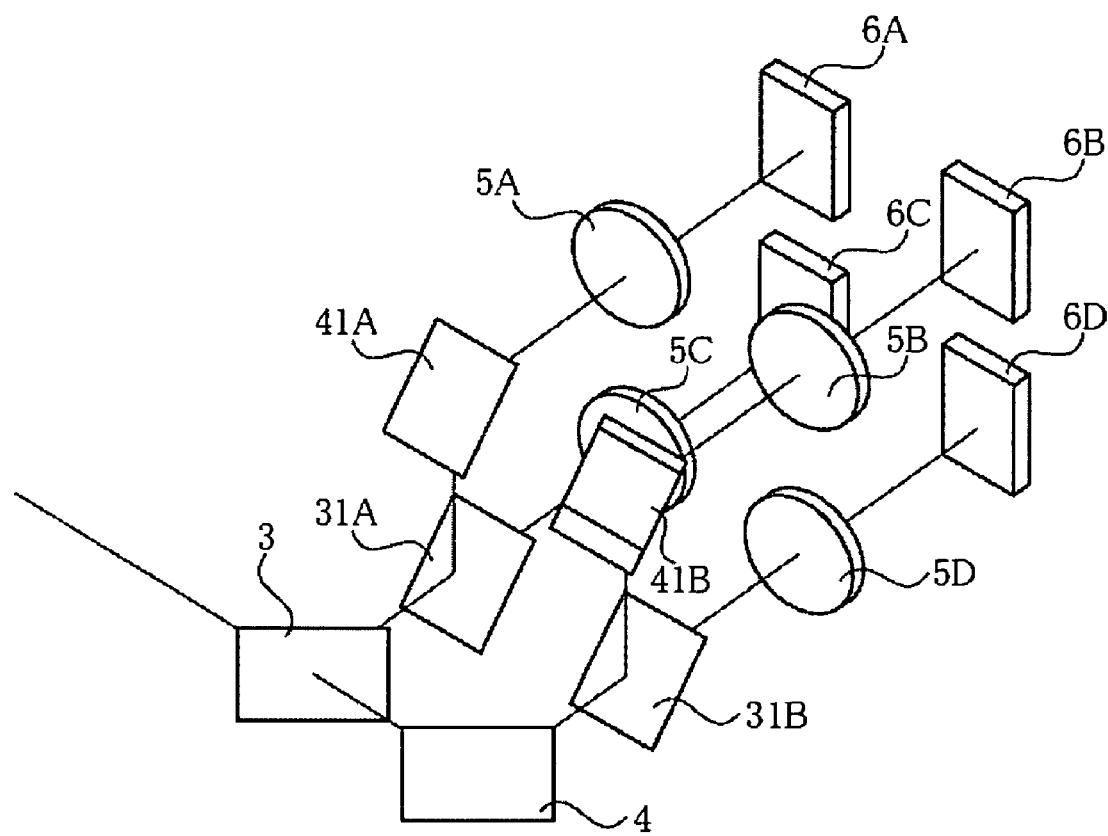
FIG. 8 is a view showing part of an illumination optical system of a second embodiment.

FIG. 8 is a view showing a part of an illumination optical system in an exposure system of a second embodiment. In order to control polarization more minutely than the first embodiment, the illumination optical system includes an optical path splitting section that is adapted to quadrisect an optical path of the light from a light source which has exited the beam shaping optical system 2, so as to control, for example, not only longitudinal and lateral directions but also ±45° directions. The optical path is, at first, split into two by the beam splitter 3, and then each of them is further split into two by beam splitters 31A and 31B, thus forming four beams. The respective beams are provided with polarization units 5A to 5D, CGH 6A to 6D, and four collimators (not shown). The illumination optical system after the optical path integrating element 8 has the same configuration as that of the embodiment shown in FIG. 1, and a description thereof will be omitted.

FIGS. 9A to 9E are an exemplary annular illumination that has a tangential polarization direction in the system of FIG. 8. Since four polarization directions are controllable along four optical paths, the instant embodiment forms annular illumination by combining four-directional linearly polarized rays of 0°, 90°, and ±45°. In other words, the first optical pat forms poitions 61A1 and A2 in the effective light source in the 0° polarization direction. The second optical path forms portions 61B1 and B2 in the effective light source in the 90° polarization direction. The third optical path forms portions 61C1 and C2 in the effective light source in the +45° polarization direction. The fourth optical path forms portions 61D1 and D2 in the effective light source in the −45° polarization direction. Thus, the whole annular illumination is formed. A CGH is used to make any effective light source. The linearly polarized light is arranged at an outer periphery of the effective light source in a tangential direction.

While this embodiment uses a structure of two CGHs of two kinds to conform to a fly's eye shape, two similar CGHs of the same type may be arranged in each optical path while rotated by 45° relative to each other, when each CGH is expected to form a shape of completely cutting a donut in the effective light source.

Of course, when the four-directional polarization directions are not needed, it is possible to use adjustment by the polarization unit 5 to arrange beams from all the CGHs into the same polarization direction, two directions or three directions. Which polarization state to choose depends upon the characteristics of a pattern to be exposed, but this embodiment can set up the CGHs for the optimum condition with ease.

Third Embodiment

The third embodiment describes a method for detecting or adjusting the light intensity in the exposure apparatus of the embodiments 1 and 2.

One issue in the illumination optical system that handles the polarization state is the way of detecting the light intensity. The optical system shown in FIG. 1 arranges the beam splitter 17 after the integrator 10, monitors the light intensity of light reflecting at 17 by a light integrator unit L1 as a monitor section, and controls the exposure dose. However, the beam splitter 17 is disposed obliquely to the optical axis of the illumination optical system, and the reflectance naturally varies depending upon polarizations. The illumination optical system of the embodiment in FIG. 1 handles the complex selection of the polarization directions, i.e., longitudinal and lateral directions as in FIGS. 3C, 4C and 5C, and ±45° directions as in FIG. 6C or other angles, and has difficulties in correctly monitoring the energy that the illumination optical system provides for the reticle by using a light intensity detecting system having polarization characteristics.

In some cases, it is necessary to balance the light intensities among optical paths. For example, a difference between the intensity of the effective light source on the X-axis of the system in FIG. 3C and that of the effective light source on the Y-axis causes a difference in critical dimension between the exposed longitudinal and lateral lines. This difference in light intensity stems from the performance of the beam splitter 3 and the individual differences of the CGHs themselves, and it may be regarded as a difference between the optical paths after being split by the element 3.

On the other hand, the dipole system like FIG. 4C or FIG. 5C forms the same image of an effective light source, the same polarization directions between the split optical paths, unlike FIG. 3C, and thus requires no light intensity matching between the split optical paths.

Therefore, such an effective light source as FIG. 3C requires an adjustment of light intensities between the split optical paths before an exposure, The present embodiment detects and adjusts the light intensities between the split optical paths by using a movable detector 18 that is arranged at a position conjugate to the reticle surface as well as calibrating the light integrator L1's value.

Instead of the detector 18 disposed at a position conjugate to the reticle surface, a photoelectric detector 25 that is disposed on a wafer stage, and can detect a light intensity at a position conjugate to the wafer position, may serve as similar functions, i.e., a detection of light intensities between split optical paths, and necessary adjustments and light integrator L1's calibration. Whether the detector 18 is used or the photoelectric detector 25 is used, the results are similar, but when the projection optical system 21 has polarization characteristics, use of the photoelectric detector 25 that detects at the wafer side will provide more accurate controlling of the exposure dose. One exemplary projection optical system 21 having polarization characteristics is a catadioptric optical system.

A description will now be given of light intensity adjustment for each optical path and a procedure for determining a light integrator's controlling conditions. At first, the illumination optical system's polarization state controlling means 5, the CGH 6 and the optical path integrating element 8's zoom are set to the exposure conditions.

Each optical path that is split by the beam splitter 3 is provided with a shutter that can independently shield the light of the optical path and a light intensity adjusting function. In detecting the light intensity of each optical path, only the light on a first optical path is allowed to pass, and the remaining light is shielded. A memory (not shown) stores a light intensity detected by the detector 18 or photoelectric detector 25 in this state and a value L1 at this time. For convenience of explanation, it is assumed that the photoelectric detector 25 detects the light intensity.

Then, a second optical path, and depending on structure, other optical paths are measured in a similar manner. First, a ratio between the output values LI and the element 25 are calculated, and a ratio between a LI controlled value and an actual light intensity is determined. Since the polarization state changes according to the illumination method, the value of this ratio needs to be calibrated again each time the illumination method (illumination mode) changes.

After that, a light intensity balance is adjusted for each optical path. As described, this step may be omitted if there is no light intensity balance required as in the dipole illumination shown in FIGS. 4C and 5C.

Figure 10:
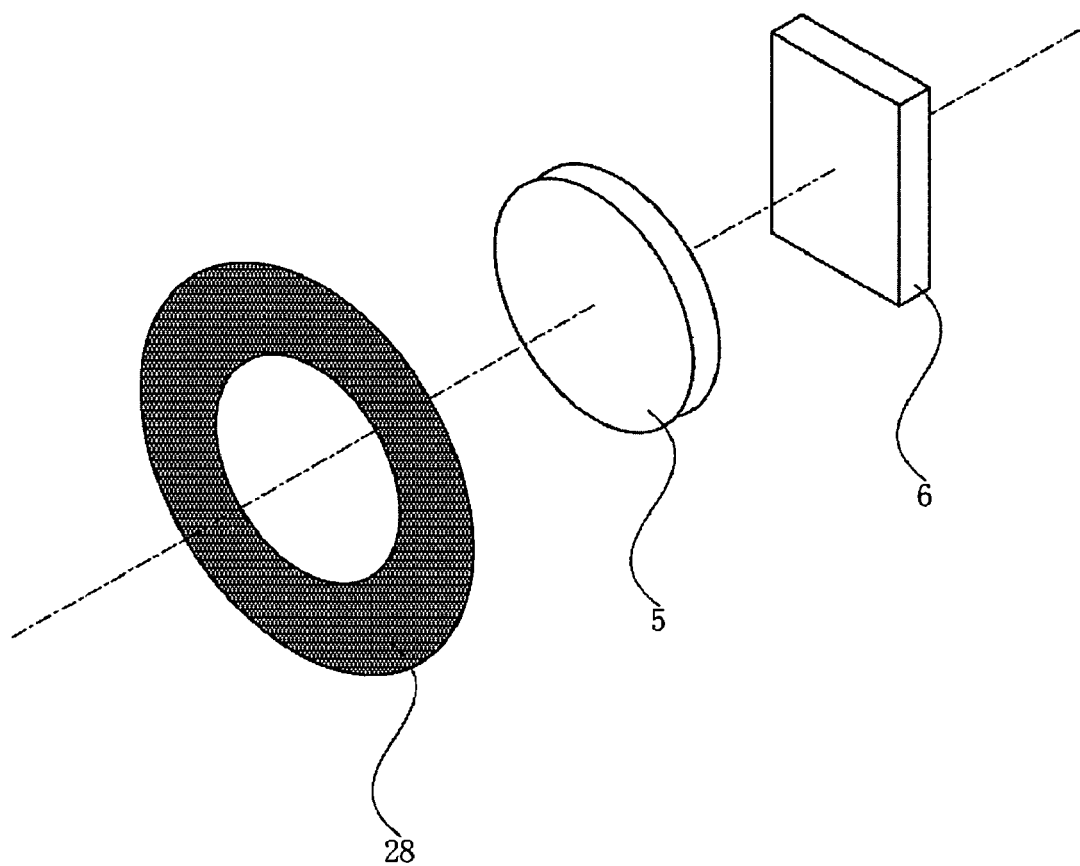
FIG. 10 is a view showing part of an illumination optical system of a third embodiment.

In the light intensity adjustment, the optical path having a minimum value is treated as a reference value among all the light intensities detected by the photoelectric detector 25, and the light intensity of each of other optical paths is adjusted to conform to this light intensity. A light intensity adjusting means provided on each optical path adjusts the light intensity. The light intensity adjusting means may use a method using an ND filter, a method that controls the diameter of a beam incident upon the CGH, etc. The method for controlling the diameter of a beam incident upon the CGH takes advantage of the fact that even if the diameter of an incident beam changes, the image formed on the integrator does not change. An actual adjustment of the light intensity ratio does not require so wide a range if the film of an initial beam splitter is correctly made. Accordingly, use of a means for varying a diameter such as an iris stop provides continuous adjustments. An ND filter requires several kinds of filters to be prepared for switching, and the space for switching, whereas the iris stop is advantageously spacesaving. The iris stop can serve as a shutter. FIG. 10 shows a structure of an optical path having a light intensity adjustment function. It is an example of an iris stop 28 that serves as a shutter, arranged before a rotational CGH 6 and the rotational λ/2 polarization unit 5. Since the light diffracts and spreads after passing through the CGH 6, the iris stop need be arranged before the CGH 6, but its position can be replaced with a position of the polarization unit 5. The light intensity adjusting means does not have to be arranged for each optical path, but may be provided only on some optical paths.

When the above light intensity adjusting means provides necessary adjustments to the light intensity ratio among optical paths and correlates the light intensity detected at the light integrator with the exposure light intensity, the exposure is ready to start.

This embodiment is applicable to exposure apparatuses of all the other embodiments.

As discussed, the invention of the above embodiment splits the optical path, and independently provides a CGH and a polarization element to each split optical path, thus controlling a polarization direction, and forming an efficient and respondent illumination optical system. The exposure optimized in the polarization state and the effective light source shape suitable for an exposed pattern greatly improves the resolution. The illumination optical system of the above embodiment, converts the light incident upon the CGH into a pattern on the integrator and polarized light by an element like the λ/2 plate, and thus achieves high efficiency with great flexibility. Use of the dipole illumination that controls the polarization with the illumination optical system of the above embodiment will enable an exposure apparatus to realize the high resolution performance without degrading the efficiency of the intended effective light source distribution.

Fourth Embodiment

Figure 12:
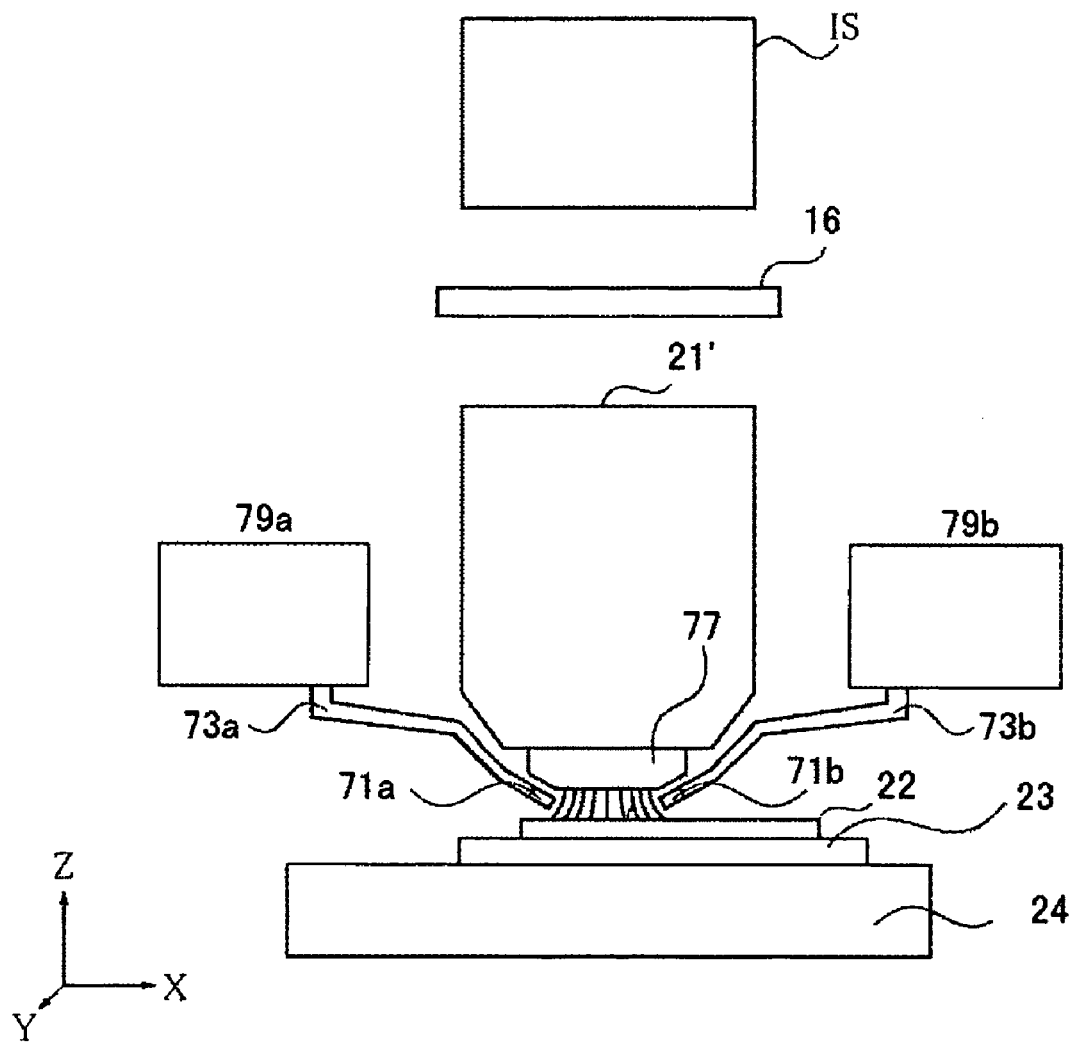
FIG. 12 is a diagram showing an immersion type exposure apparatus of a fourth embodiment.

FIG. 12 is a view showing the structure of an immersion type exposure apparatus according to the instant embodiment, and a direction vertical to the paper surface (the z direction) corresponds to the actual perpendicular direction. Like elements in the first embodiment are designated by the same reference numerals.

In the embodiment, the exposure light from an illumination apparatus IS illuminates a reticle 16, and a pattern on the reticle 16 is reduced, projected and transferred by a projection optical system 21' onto a wafer 22 as a photosensitive substrate to which a resist is applied. Here, the illumination apparatus IS has a structure similar to the first embodiment, and includes the laser 1 as a light source, and elements from the beam shaping optical system 2 to a collimator 15 in FIG. 1.

The immersion type exposure apparatus according to the instant embodiment is a so-called step-and-scan type exposure apparatus, in which the reticle 16 and the wafer 22 are synchronously scanned for exposure.

A projection optical system barrel 77 constitutes a part of the projection optical system PL, and is a member arranged closest to the wafer 22. 79a is a liquid supplying apparatus, which supplies liquid to a space between a projection optical system barrel 77 and the wafer W, thus forming a liquid film.

79b is a liquid collection apparatus, which collects liquid via a nozzle 71b and a pipe 73b.

The liquid used for an immersion type exposure apparatus is required to meet the condition that it should absorb as little exposure light as possible and let it transmit. An immersion type exposure apparatus that uses the ArF or KrF excimer laser as a light source can use pure water as the immersion liquid.

In the embodiment, the illumination optical system splits the optical path into two, puts a CGH and a polarization unit at least on one optical path, and integrates the two on the integrator's incident surface. Therefore, an intended shape of the effective light source and the polarization control are easily feasible, and the resolution performance is not affected very much even if imaging lights are orthogonal within a resist.

Fifth Embodiment

Figure 13:
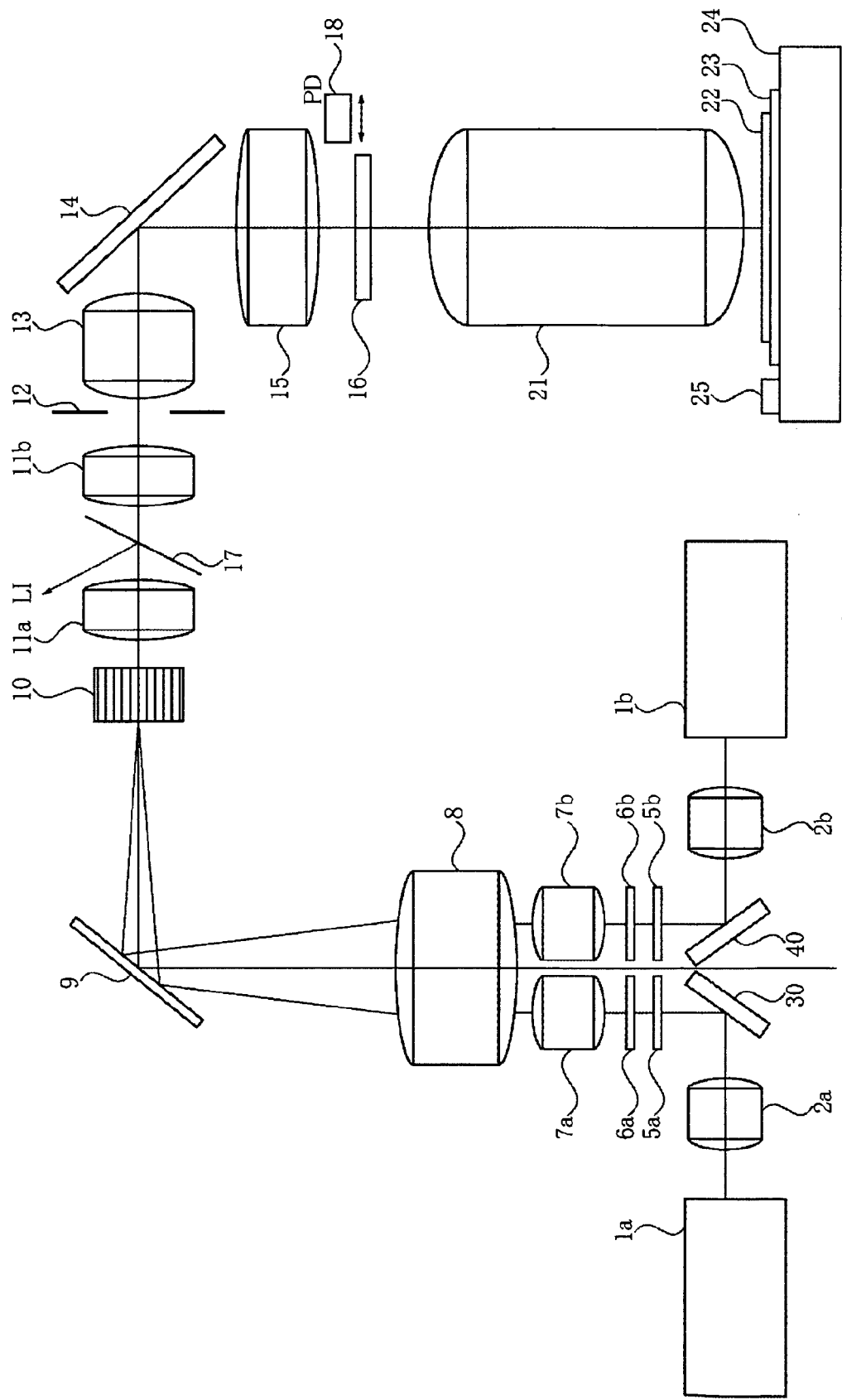
FIG. 13 is a view showing an immersion type exposure apparatus of a fifth embodiment.

FIG. 13 is a schematic view of the exposure apparatus of a fifth embodiment. The first to fourth embodiments use only one laser as a light source. On the other hand, the embodiment uses two lasers, i.e., lasers 1a and 1b, as a light source.

The first embodiment split the beam exiting the beam shaping optical system 2 by the beam splitter 3 into two beams. On the other hand, the instant embodiment uses deflection mirrors 30 and 40, introducing the beams exiting the beam shaping optical systems 2a and 2b into the polarization units 5a and 5b. Elements in FIG. 12, which are similar elements in first embodiment are designated by the same reference numerals.

When respective beams from the lasers 1a and 1b enter the deflection mirrors 30 and 40, their polarization directions are preferably parallel to each other.

While this embodiment makes the light source of two lasers, the present invention is not limited to this embodiment, and the light source may include three or more lasers. For example, the light source in the second embodiment may include four lasers.

Further, the instant embodiment's illumination apparatus (with elements from the lasers 1a and 1b to the collimator 15) may be used for the immersion type exposure apparatus of the fourth embodiment.

While the above first to fifth embodiments use a so-called step-and-scan type exposure apparatus as an exposure apparatus, a step-and-repeat type exposure apparatus may be used instead.

Sixth Embodiment

A description will now be given of an embodiment of a fabrication method for devices (semiconductor devices, liquid crystal display devices, etc.) using the above exposure apparatus.

Figure 14:
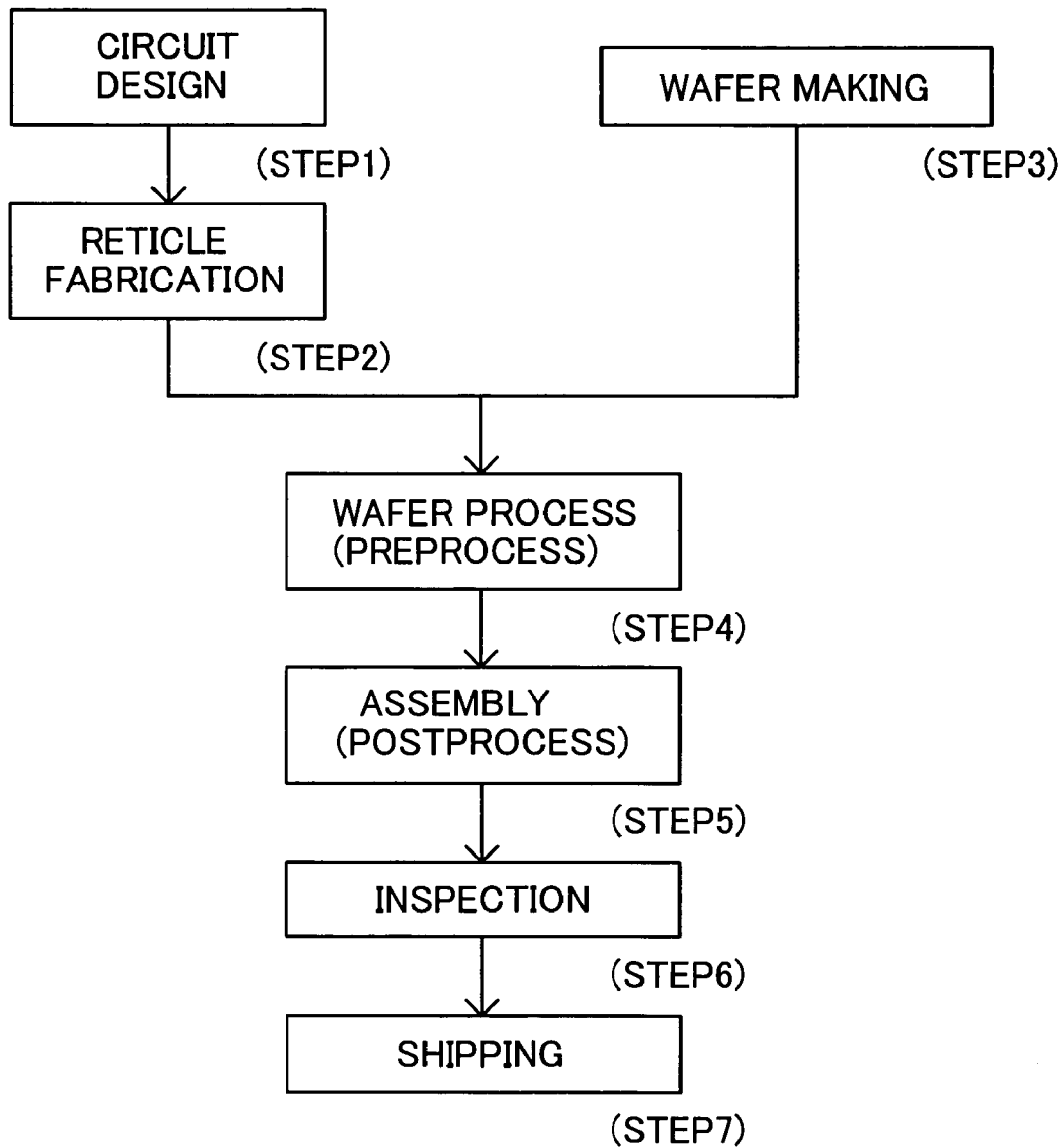
FIG. 14 is a device manufacturing flow.

FIG. 14 shows a device fabrication flowchart. Step 1 (circuit design) designs a semiconductor device circuit. Step 2 (reticle fabrication) forms a reticle having a designed circuit pattern. Step 3 (wafer preparation) manufactures a wafer as a plate (or an object to be processed) using materials such as silicon. Step 4 (wafer process), which is also referred to as a pretreatment, forms actual circuitry on the wafer through the photolithography technique using the reticle and wafer. Step 5 (assembly), which is also referred to as a posttreatment, forms into a semiconductor chip the wafer formed in Step 4 and includes an assembly step (e.g., dicing, bonding), a packaging step (chip sealing), and the like. Step 6 (inspection) performs various tests for the semiconductor device made in Step 5, such as a validity test and a durability test. Through these steps, a semiconductor device is finished and shipped (Step 7).

Figure 15:
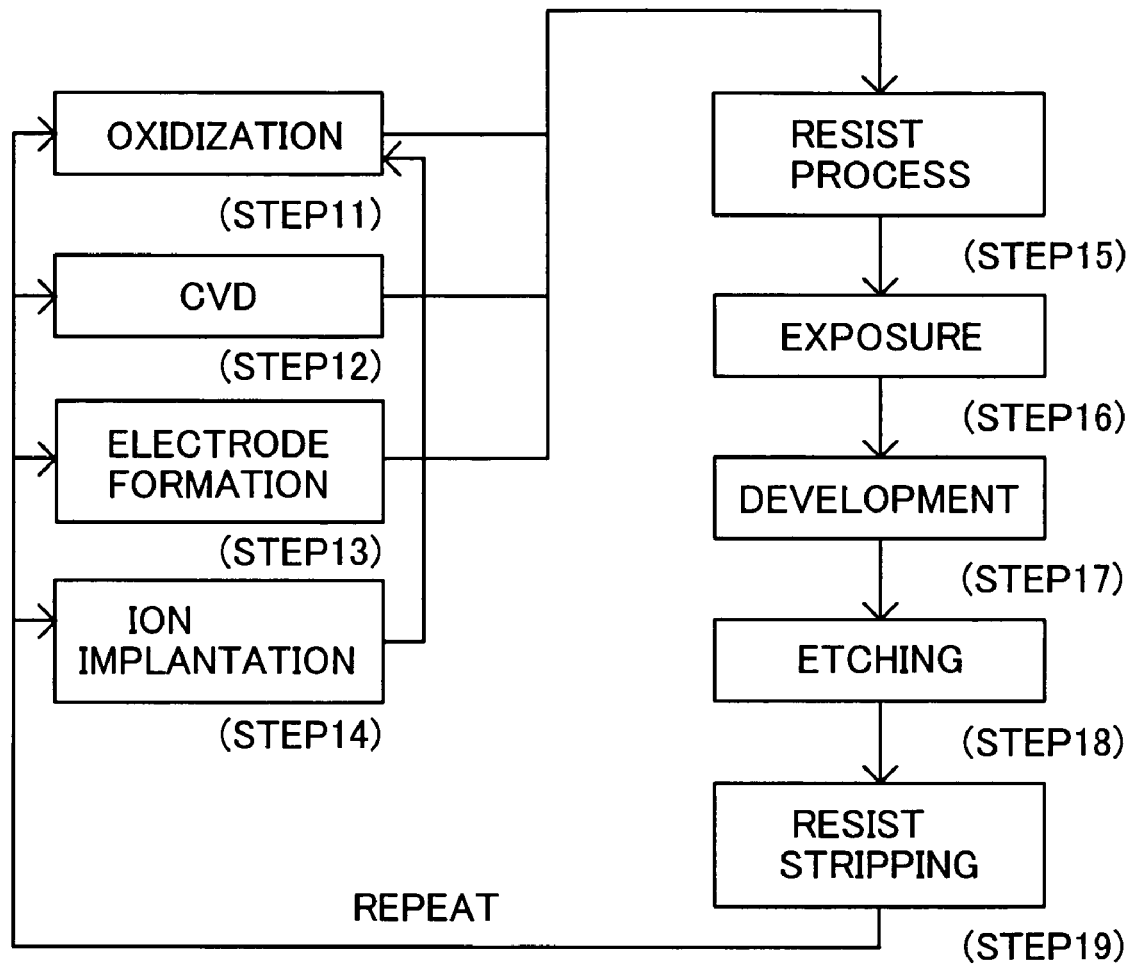
FIG. 15 is a figure showing the wafer process in FIG. 14.

FIG. 15 is a detailed flowchart of the above wafer process. Step 11 (oxidation) oxidizes the wafer's surface. Step 12 (CVD) forms an insulating film on the wafer's surface. Step 13 (electrode formation) forms electrodes on the wafer by vapor disposition. Step 14 (ion implantation) implants ions into the wafer. Step 15 (resist process) applies a resist (or a photosensitive material) onto the wafer. Step 16 (exposure) uses the above described exposure apparatus to expose a circuit pattern on the reticle onto the wafer. Step 17 (development) develops the exposed wafer. Step 18 (etching) etches parts other than a developed resist image. Step 19 (resist stripping) removes disused resist after etching. These steps are repeated, and circuit patterns are formed on the wafer.

Use of the fabrication method according to the instant embodiment makes it possible to fabricate highly integrated devices that were difficult to realize.

As many apparently widely different embodiments of the present invention can be made without departing from the spirit and scope thereof, it is to be understood that the invention is not limited to the specific embodiments thereof except as defined in the claims.

This application claims a foreign priority based on Japanese Patent Application No. 2003-321419, filed Sep. 12, 2003, which is hereby incorporated by reference herein.

The invention claimed is:

1. An illumination optical system for illuminating an illuminated surface using light from a light source, said illumination optical system comprising:
   a splitting optical system for splitting the light from the light source into light incident upon a first diffraction optical element, and light incident upon a second diffraction optical element;
   a first polarization unit for adjusting a polarization state of the light from the first diffraction optical element;
   a second polarization unit for adjusting a polarization state of the light from the second diffraction optical element; and
   an integrating optical system for integrating the light from the first diffraction optical element with the light from the second diffraction optical element, and for introducing integrated light into the illuminated surface.

2. An illumination optical system according to claim 1, further comprising an adjusting unit for adjusting a light intensity of the light from the first diffraction optical element, and/or an adjusting unit for adjusting a light intensity of the light from the second diffraction optical element.

3. An illumination optical system according to claim 2, further comprising a shielding unit arranged in an optical path of the light incident upon the first and/or second diffraction optical elements.

4. An illumination optical system according to claim 2, further comprising a detector for detecting a light intensity of the light from the first diffraction optical element and a light intensity of the light from the second diffraction optical element,
   wherein said adjusting unit adjusts a ratio between a light intensity of the light from the first diffraction optical element and a light intensity of the light from the second diffraction optical element.

5. An illumination optical system according to claim 1, further comprising an integrator for forming a plurality of secondary light sources using the light from the light source,
   wherein said integrating optical system integrates the light from the first diffraction optical element with the light from the second diffraction optical element at an incident surface of the integrator.

6. An illumination optical system according to claim 1, wherein said integrating optical system comprises a zooming optical system.

7. An illumination optical system according to claim 1, wherein said first or second polarization unit comprises a rotational λ/2 plate.

8. An illumination optical system according to claim 1, wherein the first or second diffraction optical element is rotational.

9. An illumination optical system for illuminating an illuminated surface using light from a plurality of light sources that includes first and second light sources, said illumination optical system comprising:
   a first diffraction optical element upon which the light is incident from the first light source among the plurality of light sources;
   a second diffraction optical element upon which the light is incident from the second light source among the plurality of light sources;
   a first polarization unit for adjusting a polarization state of the light from said first diffraction optical element;
   a second polarization unit for adjusting a polarization state of the light from said second diffraction optical element; and
   an integrating optical system for integrating the light from the first diffraction optical element with the light from the second diffraction optical element, and for introducing integrated light into the illuminated surface.

10. An exposure apparatus comprising:
    an illumination optical system for illuminating a reticle; and
    a projection optical system for projecting a pattern on the reticle onto a plate,
    wherein said illumination optical system includes:
       a splitting optical system for splitting light from a light source into light incident upon a first diffraction optical element and light incident upon a second diffraction optical element;
       a first polarization unit for adjusting a polarization state of the light from the first diffraction optical element;
       a second polarization unit for adjusting a polarization state of the light from the second diffraction optical element; and
       an integrating optical system for integrating the light from the first diffraction optical element with the light from the second diffraction optical element, and for introducing integrated light into the reticle.

11. An exposure apparatus according to claim 10, further comprising:
    a detector for detecting a light intensity of the light from the first diffraction optical element and a light intensity of the light from the second diffraction optical element; and
    an adjusting unit for adjusting a ratio between the light intensity of the light from the first diffraction optical element and the light intensity of the light from the second diffraction optical element.

12. An exposure apparatus according to claim 11, wherein the illumination optical system includes a monitoring section for monitoring a light intensity at a position corresponding to a surface of the reticle, and calibrates monitoring according to an adjustment of balance.

13. An exposure apparatus according to claim 11, wherein the detector detects the light intensity at a position corresponding to the surface of the reticle or a surface of the plate.

14. A device fabrication method comprising the steps of:
    exposing a plate by using an exposure apparatus; and
    developing the plate,
    wherein said exposure apparatus includes:
       an illumination optical system for illumintating a reticle; and
       a projection optical system for projecting a pattern on the reticle onto the plate;
       wherein said illumination optical system includes:
          a splitting optical system for splitting light from a light source into light incident upon a first diffraction optical element and light incident upon a second diffraction optical element;
          a first polarization unit for adjusting a polarization state of the light from the first diffraction optical element;
          a second polarization unit for adjusting a polarization state of the light from the second diffraction optical element; and
          an integrating optical system for integrating the light from the first diffraction optical element with the light from the second diffraction optical element, and for introducing integrated light into the reticle.

15. An exposure apparatus comprising:
    an illumination optical system for illuminating a reticle; and
    a projection optical system for projecting a pattern on the reticle onto a plate,
    wherein said illumination optical system includes:
       a first diffraction optical element upon which light is incident from a first light source among a plurality of light sources;
       a second diffraction optical element upon which the light is incident from a second light source among the plurality of light sources;
       a first polarization unit for adjusting a polarization state of the light from the first diffraction optical element;
       a second polarization unit for adjusting a polarization state of the light from the second diffraction optical element; and
       an integrating optical system for integrating the light from the first diffraction optical element with the light from the second diffraction optical element, and for introducing integrated light into the reticle.

16. A device fabrication method comprising the steps of:
    exposing a plate by using an exposure apparatus; and
    devleoping the plate,
    wherein said exposure apparatus includes:
       an illumination optical system for illumintating a reticle; and
       a projection optical system for projecting a pattern on the reticle onto the plate;
       wherein said illumination optical system includes:
          a first diffraction optical element upon which light is incident from a first light source among a plurality of light sources;
          a second diffraction optical element upon which the light is incident from a second light source among the plurality of light sources;
          a first polarization unit for adjusting a polarization state of the light from the first diffraction optical element;
          a second polarization unit for adjusting a polarization state of the light from the second diffraction optical element; and
          an integrating optical system for integrating the light from the first diffraction optical element with the light from the second diffraction optical element, and for introducing integrated light into the reticle.

* * * * *

UNITED STATES PATENT AND TRADEMARK OFFICE
CERTIFICATE OF CORRECTION

PATENT NO. : 7,196,773 B2
APPLICATION NO. : 10/538230
DATED : March 27, 2007
INVENTOR(S) : Suzuki It is certified that error appears in the above-identified patent and that said Letters Patent is hereby corrected as shown below:

In the Specification:

In col. 4, line 24, please replace "Sa" with --5a--.
In col. 5, line 21, please replace "band" with --hand--.
In col. 5, line 48, please replace "FIG. 4 shows" with --FIGS. 4A to 4C show--.
In col. 5, line 49, please replace "FIG. 3" with --FIG. 3A--.
In col. 5, line 63, please replace "FIG. 3" with --FIG. 3C--.
In col. 7, line 13, please replace "tune" with --time--.
In col. 7, line 21, please replace "maine" with --same--.
In col. 8, line 7, please replace "pat" with --path--.
In col. 8, line 7, please replace "poitions" with --portions--.

In the Claim:

In Claim 2 (col. 12, lines 44-45), please replace "clement" with --element--.

Signed and Sealed this

Twenty-second Day of May, 2007

JON W. DUDAS
*Director of the United States Patent and Trademark Office*